(12) United States Patent
Jain et al.

(10) Patent No.: US 12,265,121 B2
(45) Date of Patent: Apr. 1, 2025

(54) COMPRESSION-BASED SCAN TEST SYSTEM

(71) Applicant: STMicroelectronics International N.V., Geneva (CH)

(72) Inventors: Sandeep Jain, Noida (IN); Shalini Pathak, Gurgaon (IN); Prateek Singh, Delhi (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/322,336

(22) Filed: May 23, 2023

(65) Prior Publication Data

US 2024/0393393 A1  Nov. 28, 2024

(51) Int. Cl.
*G01R 31/3181* (2006.01)
*G01R 31/3185* (2006.01)

(52) U.S. Cl.
CPC .......... *G01R 31/31813* (2013.01); *G01R 31/318536* (2013.01); *G01R 31/318552* (2013.01)

(58) Field of Classification Search
CPC ...... G01R 31/31813; G01R 31/318552; G01R 31/318536
See application file for complete search history.

(56) References Cited

U.S. PATENT DOCUMENTS

| | | | |
|---|---|---|---|
| 6,654,920 B1 | 11/2003 | Hetherington et al. | |
| 7,802,159 B1 * | 9/2010 | Chakravarty | G01R 31/3187 714/733 |
| 8,645,780 B2 | 2/2014 | Wohl et al. | |
| 8,683,280 B2 | 3/2014 | Rajski et al. | |
| 8,836,746 B2 | 9/2014 | Kawamura | |
| 9,470,754 B1 | 10/2016 | Chickermane et al. | |
| 9,817,068 B1 * | 11/2017 | Chickermane | G01R 31/318335 |
| 10,234,505 B1 * | 3/2019 | Shivaray | G01R 31/318552 |
| 11,262,403 B2 * | 3/2022 | Watanabe | G01R 31/3177 |
| 11,555,854 B2 | 1/2023 | Liu et al. | |

(Continued)

OTHER PUBLICATIONS

Liu, Yingdi et al., "Deterministic Stellar BIST for Automotive ICs", IEEE Transactions on Computer-Aided Design of Integrated Ciruits and Systems, vol. 39, No. 8, Aug. 2020, 12 pages.

(Continued)

*Primary Examiner* — Samir W Rizk
(74) *Attorney, Agent, or Firm* — Slater Matsil, LLP (57) ABSTRACT

In accordance with an embodiment, a method for operating a Pseudo-Random Pattern Generator (PRPG) based scan test system includes: generating test patterns using a Pseudo-Random Pattern Generator (PRPG), generating the test patterns including clocking the PRPG using a first clock signal; loading the test patterns into a plurality of scan chains coupled to the PRPG; modifying a bit distribution of the generated test patterns with respect to the plurality of scan chains by freezing at least one clock cycle of the first clock signal while a second clock signal is active or freezing at least one clock cycle of the second clock signal while the first clock signal is active; shifting the loaded test patterns using the second clock signal; applying the test patterns to a circuit under test (CUT) through the plurality of scan chains; and capturing response patterns generated by the CUT in the plurality of scan chains.

26 Claims, 8 Drawing Sheets

(56) References Cited

U.S. PATENT DOCUMENTS

| | | |
|---|---|---|
| 2008/0195904 A1 | 8/2008 | Wang |
| 2017/0097388 A1* | 4/2017 | Parasrampuria ............................. G01R 31/318547 |
| 2021/0063489 A1* | 3/2021 | Watanabe .......... G01R 31/3177 |
| 2023/0079000 A1 | 3/2023 | Sarmiento et al. |

OTHER PUBLICATIONS

Mrugalski, Grzegorz et al., "A Deterministic BIST Scheme Based on EDT-Compressed Test Patterns", IEEE International Test Conference (ITC), Oct. 6-8, 2015, 8 pages.

Mrugalski, Grzegorz, et al., "Star-EDT: Deterministic On-Chip Scheme Using Compressed Test Patterns", IEEE Transactions on Computer-Aided Design and Integrated Circuits and Systems, vol. 36, No. 4, Apr. 2017, 11 pages.

* cited by examiner

COMPRESSION-BASED SCAN TEST SYSTEM

TECHNICAL FIELD

The present invention relates generally to the field of circuit testing and, more specifically, to a compression-based scan test system.

BACKGROUND

Integrated circuits are common components in numerous electronic devices and systems, and as the complexity of these circuits increases, detecting and diagnosing faults within them becomes more challenging. In particular, identifying manufacturing defects and design flaws helps ensure proper functioning of the circuits and overall reliability of electronic devices.

Scan testing is a prevalent technique for detecting faults in digital circuits. During a scan test, a test pattern is applied to the inputs of a circuit under test (CUT), and the response pattern is observed at the outputs. These test patterns and response patterns are often generated and processed using test compression architectures to minimize the amount of data required for testing. However, as the size and complexity of integrated circuits grow, test data volume and test application time increase, leading to higher testing costs and longer time-to-market.

To address these challenges, various test data compression techniques have been developed to reduce test data volume and test application time. These techniques typically involve the use of compressors and decompressors in combination with a sequential pattern generator, such as pseudo-random patter generator (PRPG) or a combinatorial pattern generator to generate compressed test patterns and process response patterns.

SUMMARY

In accordance with an embodiment, a method for operating a Pseudo-Random Pattern Generator (PRPG) based scan test system includes: generating test patterns using a Pseudo-Random Pattern Generator (PRPG), generating the test patterns including clocking the PRPG using a first clock signal; loading the test patterns into a plurality of scan chains coupled to the PRPG; modifying a bit distribution of the generated test patterns with respect to the plurality of scan chains by freezing at least one clock cycle of the first clock signal while a second clock signal is active or freezing at least one clock cycle of the second clock signal while the first clock signal is active; shifting the loaded test patterns using the second clock signal; applying the test patterns to a circuit under test (CUT) through the plurality of scan chains; and capturing response patterns generated by the CUT in the plurality of scan chains.

In accordance with another embodiment, a system includes: a test system configured to be coupled to a circuit under test (CUT), the test system including: a pattern generation circuit including a Pseudo-Random Pattern Generator (PRPG) coupled to a first clock input; a plurality of scan chains coupled to an output of the PRPG and configured to be coupled to the CUT, the plurality of scan chains including registers having clock inputs coupled to a second clock input; an evaluation circuit coupled to the plurality of scan chains, the evaluation circuit configured to capture response patterns generated by the CUT in the plurality of scan chains; and a control circuit configured to modify a bit distribution of test patterns generated by the PRPG with respect to the plurality of scan chains by freezing at least one clock cycle of the first clock signal while the second clock signal is active or freezing at least one clock cycle of the second clock signal while the first clock signal is active.

In accordance with a further embodiment, an integrated circuit includes: a control circuit configured to produce a modified clock signal based on an input clock signal, and freeze at least one clock cycle of the modified clock signal while the input clock signal is active; a Pseudo-Random Pattern Generator (PRPG) based decompressor having an input configured to receive at least one seed value, where the PRPG-based decompressor includes a clock input configured to receive the input clock signal; a plurality of scan chains coupled to the PRPG-based decompressor, the plurality of scan chains having registers with clock inputs configured to receive the modified clock signal; a compressor coupled to the plurality of scan chains, the compressor including a clock input configured to receive the input clock signal; and a circuit under test (CUT) coupled to the plurality of scan chains.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in the specific context of an on-chip test system. The invention, however, can be used to for other types of test systems.

In a scan test system, the primary goal is to detect faults in a circuit under test (CUT) by applying test patterns to the inputs of the CUT and observing the response patterns at its outputs. These test patterns consist of a combination of care-bits and don't care bits, which have different roles in the testing process.

Care-bits are the bits in the test patterns that are relevant to the testing process and are configured to detect faults in the CUT. These bits correspond to specific inputs of the CUT that have a direct impact on the test outcome. Controlling the care-bits ensures that the test patterns applied to the CUT can effectively stimulate the circuit elements and reveal potential faults. Don't care bits, on the other hand, are the bits in the test patterns that are not explicitly targeted by pattern generator, and therefore their values can be arbitrarily filled during the pattern. By not constraining the values of the don't care bits, the testing process becomes more flexible, and the test data can be compressed more effectively.

In PRPG-based testing, Pseudo-Random Pattern Generators (PRPGs) are used to generate test patterns consisting of both care-bits and don't care bits. The PRPG generates pseudo-random sequences of bits, which can be utilized to fill the don't care bit positions in the test patterns while ensuring that the care-bits are applied to the corresponding inputs of the CUT.

The temporal spacing of care-bits and don't care bits in the test patterns can significantly impact the test time and effectiveness of PRPG-based testing. The distribution of care-bits and don't care bits in the test patterns influences the probability of detecting faults in the CUT and the efficiency of test data compression techniques. For example, when testing a design where scan data is loaded through decompressor, if the care-bits are clustered together within few scan-cycles, it a large effort is needed on the part of the PRPG engine to meet the care-bits requirements; hence the amount of faults detected in a single pattern decreases.

As a practical matter, since the PRPG generates a pseudo-random series of bits, it is sometimes difficult to get the desired states within the same or in consecutive slices, where a slice represents a plurality of states, register, scan flop or logic values that are positioned within the same shift cycle of a plurality of scan chains or reside at the same scan-position across all active scan chain. This may result in longer test times and a lower probability of finding difficult to detect faults.

Accordingly, embodiments of the invention are directed to automatic test pattern generation (ATPG) based test systems that use scan compression/Logic built-in self-test (BIST) that incorporates a Pseudo-Random Pattern Generator (PRPG) to generate test bits to one or more scan chains. In various embodiments, the distribution of care bits with respect to don't care bits is modified by removing some of the PRPG generated slices, thereby allowing the PRPG more flexibility to generate more states such that the highly co-related bits can be slightly de-coupled and a more efficient pattern set can be generated that increases the probability of positioning relevant care bits in the same slice or adjacent slices. In one embodiment, these PRPG bits may be modified by freezing the clock of the scan chain for one or more cycles while the PRPG continues its operation. Alternatively, the clock of the PRPG could be frozen while the scan chain continues its operation such that the scan chain is over-scanned. By modifying the timing relationship of the PRPG to the scan chain, the correlation of PRPG bits can be reduced and care bits can be advantageously be clustered in order to increase the probability of finding hard to detect faults and to decrease the test time.

Figure 1A:
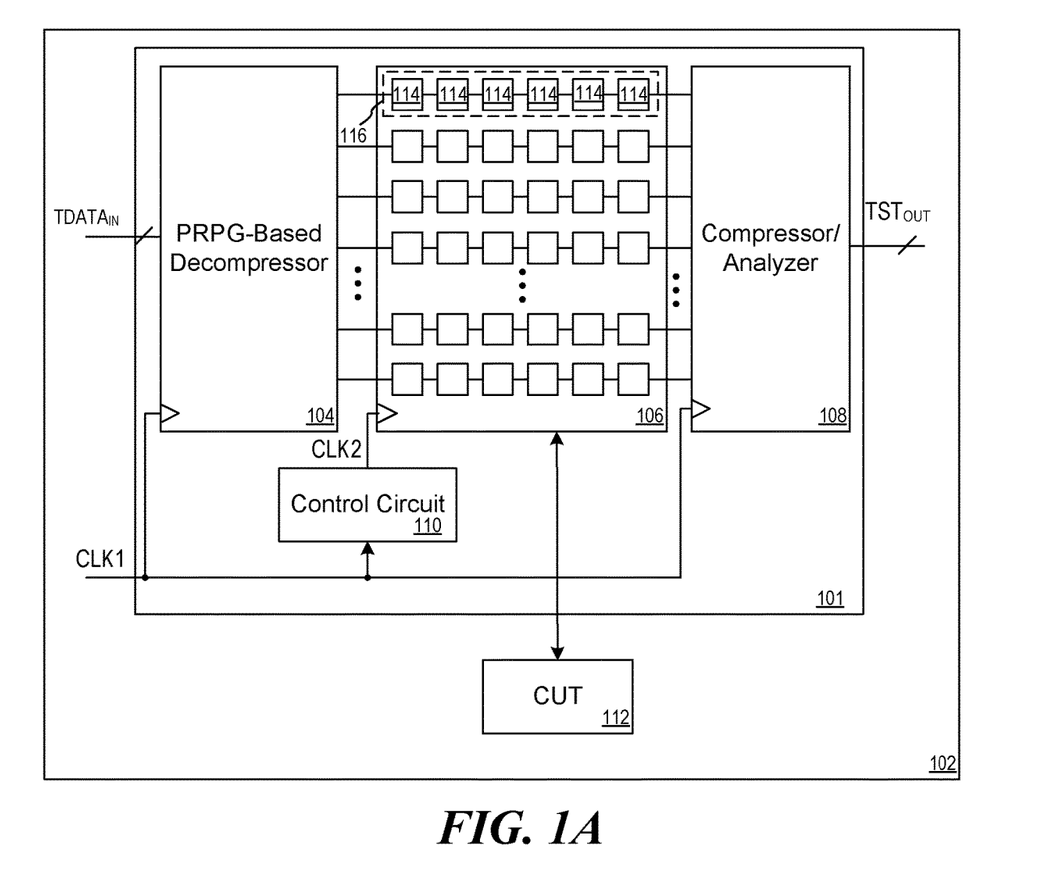
FIG. 1A illustrates a block diagram of an integrated circuit that includes a PRPG-based test system according to an embodiment.

Referring now to FIG. 1A, a block diagram of an integrated circuit 102 is shown. The integrated circuit 102 includes a PRPG-based scan test system 101 connected to a circuit under test (CUT) 112. The scan test system 101 is designed to test the functionality and detect faults in the CUT 112 using a scan testing process.

The PRPG-based scan test system 101 comprises a PRPG-based decompressor 104 (also referred to as a pattern generation circuit), a scan chain block 106 including multiple scan chains 116, and a compressor/analyzer 108 (also referred to as an evaluation circuit). The PRPG-based decompressor 104 generates decompressed test patterns that are used to test the CUT 112. The output of the decompressor 104 is coupled to multiple scan chains 116, each of which includes a chain of registers 114. The output of each scan chain 116 is connected to the compressor/analyzer 108, which compresses the scan chain data and generates a signature for comparison to a reference signature. In some embodiments, compressor/analyzer 108 may be further configured to determine whether there is a fault in the CUT 112 based on the response patterns received from scan chains 116. As shown, PRPG-based decompressor 104 and compressor/analyzer 108 are clocked by a system input clock CLK1, while the scan chain block 106 is clocked by a modified clock CLK2 that is generated by control circuit no based on the system input clock CLK1.

The operation of the PRPG-based scan test system 101 begins with the test pattern loading phase. In this phase, the PRPG-based decompressor 104 receives compressed test patterns $TDATA_{IN}$, decompresses them, and generates decompressed test patterns. These decompressed test patterns are then shifted into the multiple scan chains 116 using modified clock signal CLK2 that is coupled to each register 114 at a respective clock input (not shown). Each scan chain 116 receives a portion of the decompressed test pattern and stores it in respective registers 114. Compressed test patterns $TDATA_{IN}$ may include one or more seed values that are either externally introduced to integrated circuit 102 via a test system (such as an automated test system), or may be stored within a memory resident on integrated circuit 102.

In an embodiment of the present invention, control circuit 110 selectively stops the one or more clock cycles of the modified clock signal CLK2. This has the effect of selectively removing slices of the test patterns generated by PGPG-based decompressor 104 as will be discussed in further detail below with respect to FIGS. 1B, 1C, 1D, 2A and 2B. In an alternative embodiment (not shown) system clock CLK1 is provided to scan chain block 106 and compressor/analyzer 108, while the modified clock CLK2 is provided to PRPG-based decompressor 104. This has the effect of clocking the same pattern on a plurality scan chain columns. Control circuit no may also be configured to control the overall operation of scan test system 101 including its various phases of operation. In further embodiments, scan test system 101 may utilize three or greater clock in which clock cycles are skipped in one or more of the three or greater clocks.

Following the test pattern loading phase is the test pattern application phase, during which the test pattern data stored in the scan chains 116 is applied to the inputs of the CUT 112. This stimulates the CUT 112 and causes it to generate response patterns based on the applied test pattern data.

After the test pattern application phase, the response pattern capture phase takes place. In this phase, the response patterns generated by the CUT 112 are captured and stored in the registers 114 of the scan chains 116. Each scan chain 116 captures a portion of the response pattern produced by the CUT 112.

Finally, the response pattern analysis phase occurs. In this phase, the response patterns stored in the scan chains 116 are shifted out and provided to the compressor/analyzer 108. The compressor/analyzer 108 processes the response patterns to generate a set of signatures that may be compared to a set of expected "golden patterns." This comparison may be performed by an external tester or by circuitry within compressor/analyzer 108 depending on the particular system and is specifications. If the response patterns match the expected golden patterns, it indicates that the CUT 112 is functioning correctly. If there is a mismatch, it suggests the presence of a fault in the CUT 112.

In various embodiments, the components of integrated circuit 102 may be disposed on a single monolithic semiconductor integrated circuit, such as a single semiconductor substrate, and/or on the same monolithic semiconductor integrated circuit as other disclosed system components. The semiconductor substrate may be a silicon substrate. Integrated circuit 102 may be fabricated using one of a variety of different semiconductor processes, such as a CMOS process, BiCMOS process, Bipolar process, or other type of process.

Figure 1B:
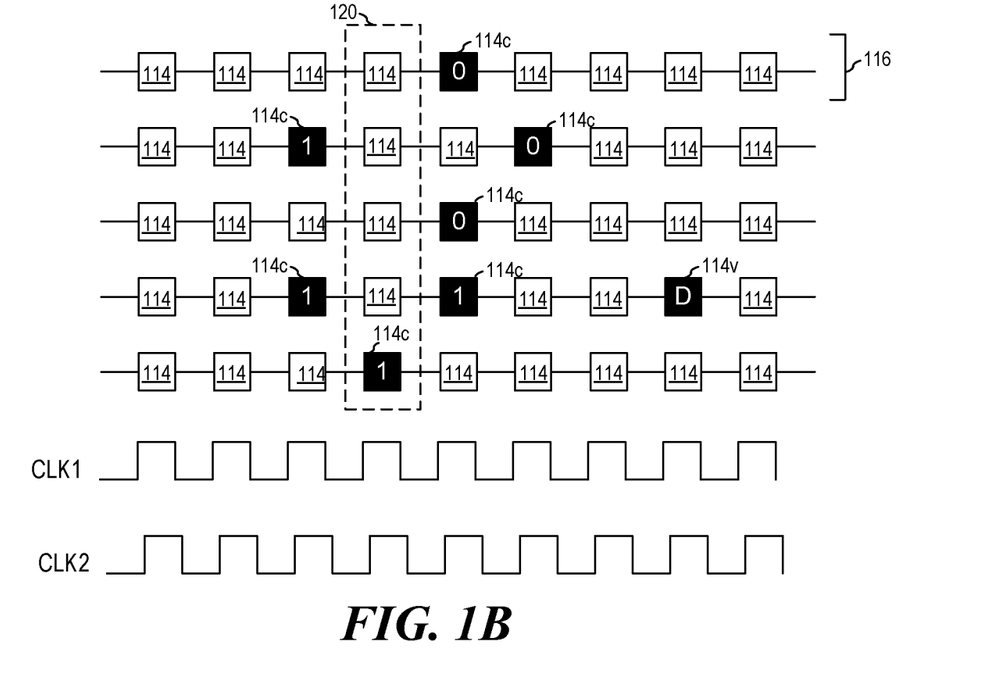
FIGS. 1B and 1C contain illustrative diagrams and timing diagram illustrating the operation of the PRPG test system.
Figure 1C:
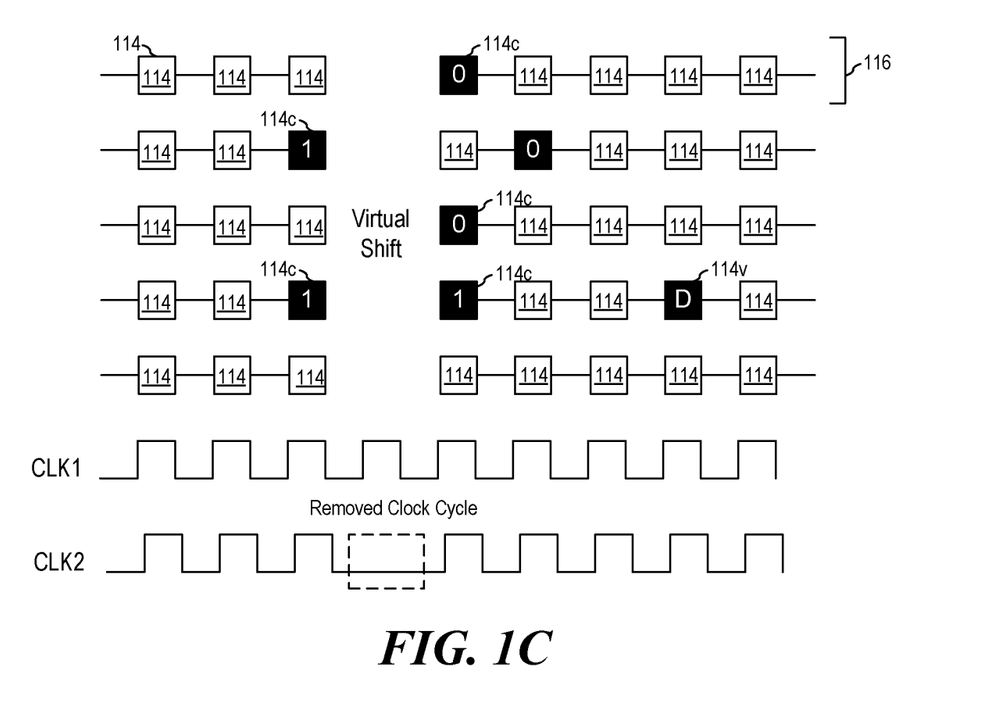

FIGS. 1B and 1C are illustrative diagrams that show the effect of the modified clock CLK2 on the test patterns generated by PRPG-based decompressor 104 and stored in the scan chains 116 of scan chain block 106. FIG. 1B illustrates a block diagram of scan chain block 106 with digital values "0" or "1" for care bits designated in selected registers 116c highlighted in black that were generated by PRPG-based decompressor 104. Register 114v is shown containing an observed data value "D" that was produced by CUT 112 based on the care bits stored in registers 116c. Remaining registers 114 include don't care bits. A slice 120 represented by registers 114 containing don't care bits and a register having care bit 114c is denoted by a dashed box. In some embodiments, the don't care bits in this column do not contribute toward the ability of PRPG-based scan test system 101 to determine faults in CUT 112, and serve to increase the time that it takes to test CUT 112. It should be understood that in various embodiments, the removed slice 120 may or may not contain care bits, as some care bit might not be at the correct position to test CUT 112 efficiently.

In an embodiment, a slice of values represented by slice 120 are removed from the test pattern stored in scan chain block 106 by removing a cycle of modified clock CLK2 associated with these values. The effect of this is shown in FIG. 1B which illustrates the scan chain registers 114, 114c and 114v with slice 120 removed. By removing the clock cycle of modified clock CLK2 corresponding to slice 120, a virtual shift is achieved in the test values such that the test value in the columns surrounding column 120 become contiguous. From a functional perspective, removing the clock cycle of modified clock CLK simply stops the clock that shifts test pattern data into scan chain block 106 while PGPG-based decompressor 104 and compressor/analyzer 108 continue to operate. Effectively, the data associated with column 120 is not shifted into scan chain block 106 and is not used as input to CUT 112. As such, test patterns which were formally not possible due to the manner in which data was correlated from decompressor 104 can be advantageously generated. In other words, care-bits can be more efficiently be generated by decompressor 104 with a higher degree of certainty.

In some embodiments, this dense pattern of care bits reduces test time and increases the probability that hard-to-detect faults in CUT 112 are uncovered.

Figure 1D:
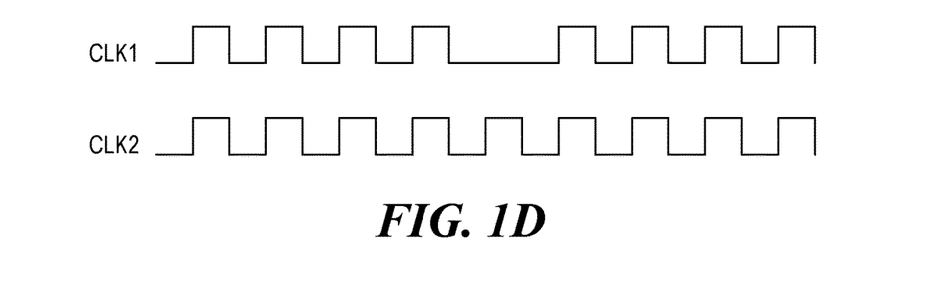
FIG. 1D illustrates an associated timing diagram.

In alternative embodiments of the present invention, alternative clocking schemes can be used. For example, instead of modifying the clock CLK2 coupled to scan chain block 106, the clock CLK1 provided to PGPG-based decompressor 104 may be modified to skip cycles as shown in FIG. 1D. This effectively causes a single column (or slice) of values generated by PGPG-based decompressor 104 to be stored in two adjacent columns of registers in scan chain block 106. Hence, a repeated column or slice of values containing care bits can be repeated over two or more columns of scan registers 114.

Figure 1E:
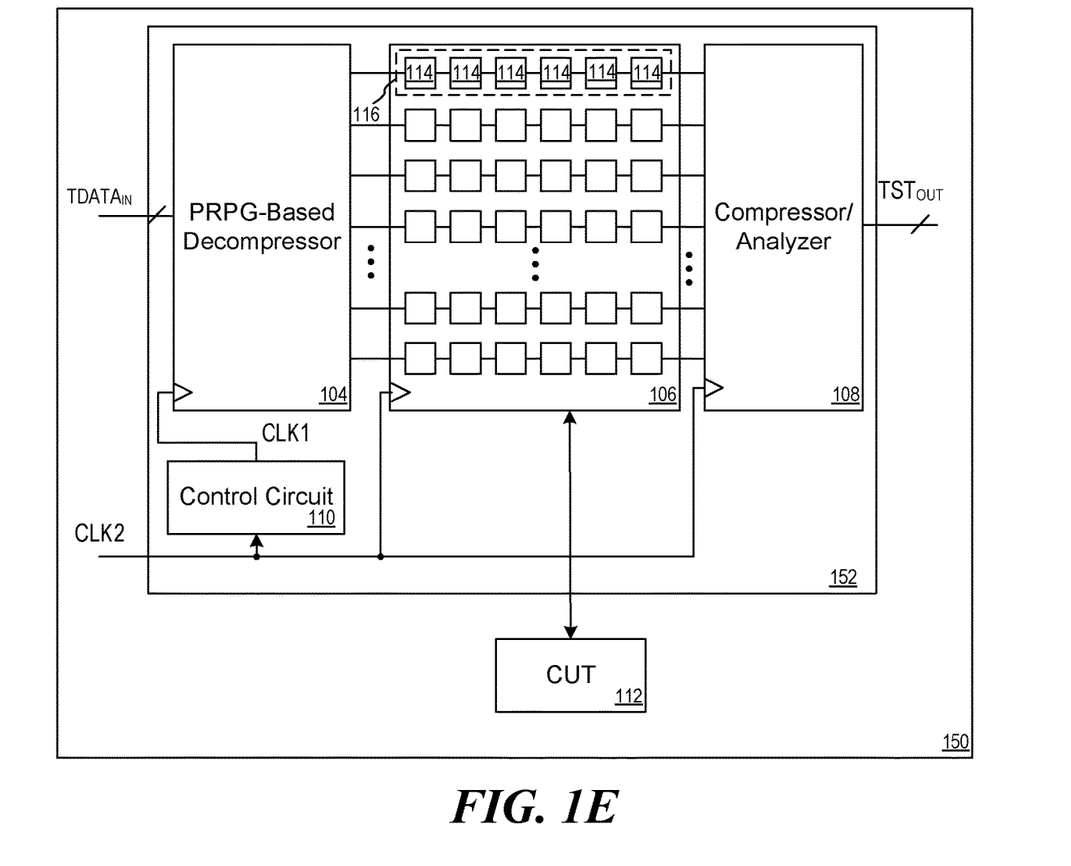
FIG. 1E illustrates a block diagram of an integrated circuit according to an alternative embodiment.

FIG. 1E illustrates a block diagram of an integrated circuit 150 is shown that includes PRPG-based scan test system 152 that implements the clocking scheme described above with respect to FIG. 1D. As shown PRPG-based scan test system 152 is similar to PRPG-based scan system 101 shown in FIG. 1A with the exception that the input clock is provided by clock CLK2, which is an unmodified clock that is coupled to scan chain block 106 and compressor/analyzer 108. The output of control circuit 110 is a modified clock CLK1 that clocks PRPG-based decompressor 104.

Figure 2A:
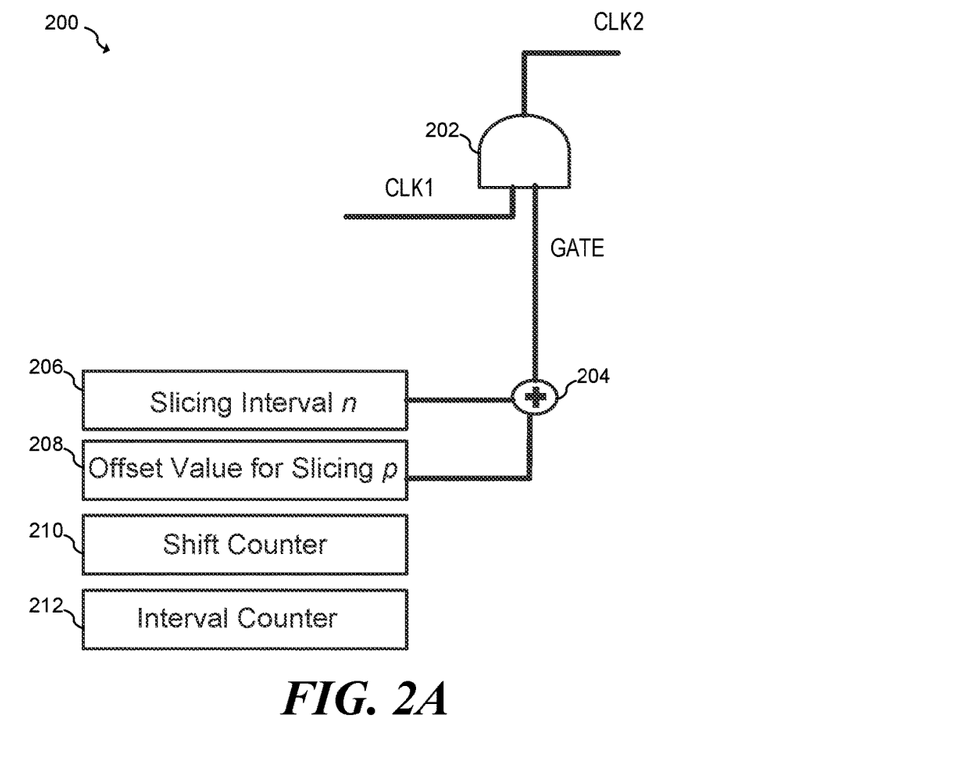
FIG. 2A illustrates a block diagram of an embodiment control circuit.

FIG. 2A illustrates a block diagram of an embodiment control circuit 200 that may be used to implement control circuit 110 shown in FIG. 1A. As shown, control circuit 200 includes a clock gating circuit 202 that is used to gate input clock signal CLK1 to produce modified clock signal CLK2. Slicing interval register 206, offset value register 208, shift counter 210 and interval counter 212, and adder 204 work together to produce gate signal GATE.

In an embodiment, at the start of each test pattern loading phase, shift counter 210 counts a number of cycles p that is stored in offset value register 208. After p cycles, gating signal GATE is asserted, which inhibits a clock cycle of CLK2 via gating circuit 202. Thereafter, interval counter 212 counts a number of cycles n stored in the slicing interval register 206. After n cycles, gating signal GATE is again asserted, which inhibits another clock cycle of modified clock signal CLK2 via gating circuit 202. Interval counter 212 continues to count n cycles and gating signal GATE is asserted every n cycles thereafter until the completion of the test pattern loading phase. In alternative embodiments, the operation of control circuit 200 may be achieve using other logic architectures known in the art such as a programmable processor, a state machine, or other known logic circuit to configured to perform the same or similar function.

Figure 2B:
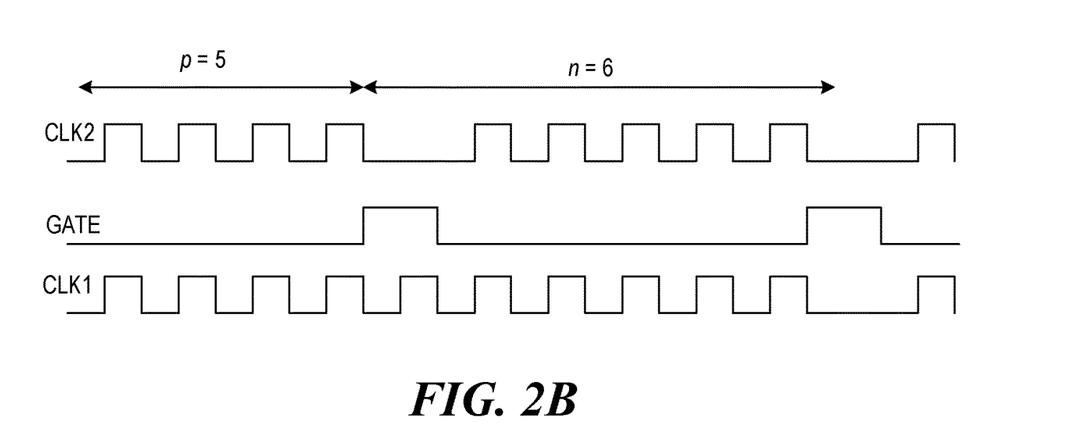
FIG. 2B is a timing diagram that illustrates the operation of the control circuit of FIG. 2A.

The operation of control circuit 200 is illustrated with respect to the timing diagram of FIG. 2B for an offset value of p=5 and an interval value of n=6. As shown, after p=5 cycles of input clock CLK1, gating signal GATE is asserted, which inhibits a cycle of modified clock CLK2. Subsequently, after p+1n=5+6=11 cycles of input clock CLK1, gating signal GATE is again asserted, which inhibits a cycle of modified clock CLK2. Similarly, after p+2n=17 cycles, the gating signal is again asserted. This continues till the shift interval completes for one pattern and then repeated. It should be understood that the values of p=5 and n=6 are merely example values used for the purpose of illustration. In alternative embodiments any integer zero and greater may be used for p and n.

While the example of FIGS. 2A and 2B show a periodic modification of the clock CLK2, non-periodic patterns may also be used. For example, cycles of CLK2 may be skipped according to an arbitrary pattern stored in memory, or a pseudorandom pattern may be provided using a pseudorandom pattern generator such as a linear feedback shift register.

In various embodiments, clock gating circuit 202 may be implemented using a digital logic gate such as an AND gate or a NAND gate. Slicing interval register 206 and offset value register 208 may be implemented using register circuits (such as a plurality of flip-flops). Shift counter 210 and interval counter 212 may be implemented using a counter circuit known in the art, for example, a register coupled to a full adder. In some embodiments, the contents of the slicing interval register and the offset value register may be programmable and may be modified via a communication interface (not shown).

Figure 2C:
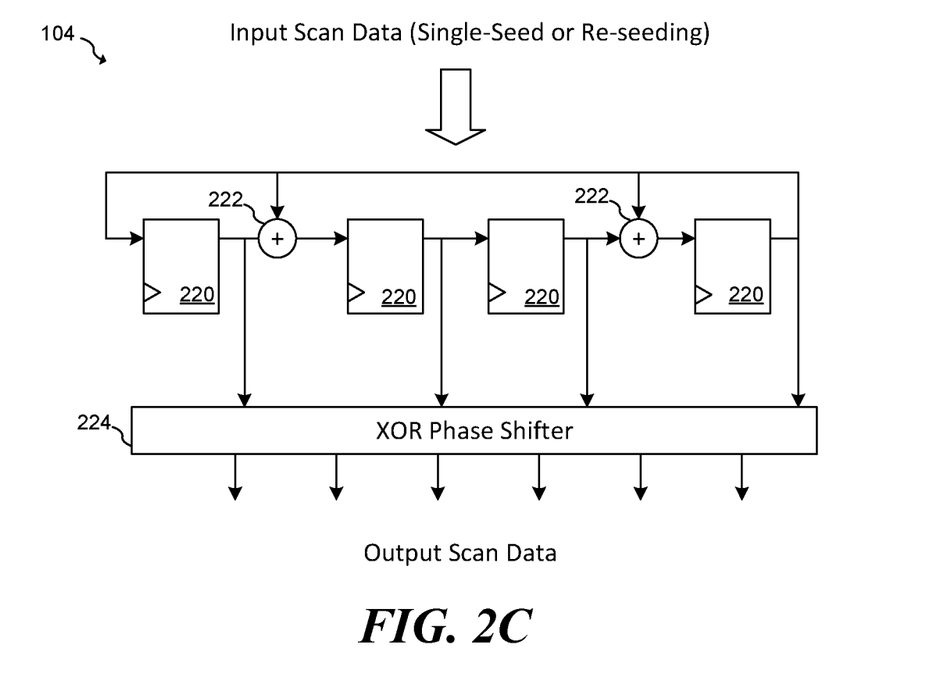
FIG. 2C illustrates a schematic of an embodiment PRPG-based decompression circuit.

Referring now to FIG. 2C, a schematic of a PRPG-based decompressor 104 is illustrated that may be used to implement PGPG-based decompressor 104. PGPG-based decompressor 104 is configured to provide test pattern data by providing pseudorandom test data based on one or more seeds provided as input scan data. Alternatively, PGPG-based decompressor 104 may be configured to decompress compressed test patterns generated by a PRPG-based compressor introduced as input scan data. The decompressor includes a plurality of registers 220, XOR gates 222 coupled to selected ones of the registers, and XOR phase shifter 224 connected to the output of each register 220.

The plurality of registers 220 are utilized for storing and processing the seed value(s) or compressed test pattern data. Each register 220 is configured to receive input scan data, which may be loaded directly into the respective register. XOR gates 222 are coupled to selected registers 220 and are configured to perform exclusive OR operations on the values of the last registers in the sequence and feed the results back into the inputs of the respective registers connected to the outputs of the respective XOR gates 222. This feedback mechanism is used to generate pseudorandom test patterns or decompressed test patterns based on the input scan data.

The output data from each register 220 is processed by the XOR phase shifters 224, which perform exclusive OR operations on the data. The output scan data, representing the decompressed test patterns, is produced by the XOR phase shifter 224 and can then be utilized in the scan testing process. It should be understood that the topology of PGPG-based decompressor 104 shown in FIG. 2C is just one example of many possible topologies. For example, in alternative embodiments, greater or fewer registers may be used and/or greater or fewer XOR gates 222 may be used and/or may be coupled to different registers as is shown.

Figure 2D:
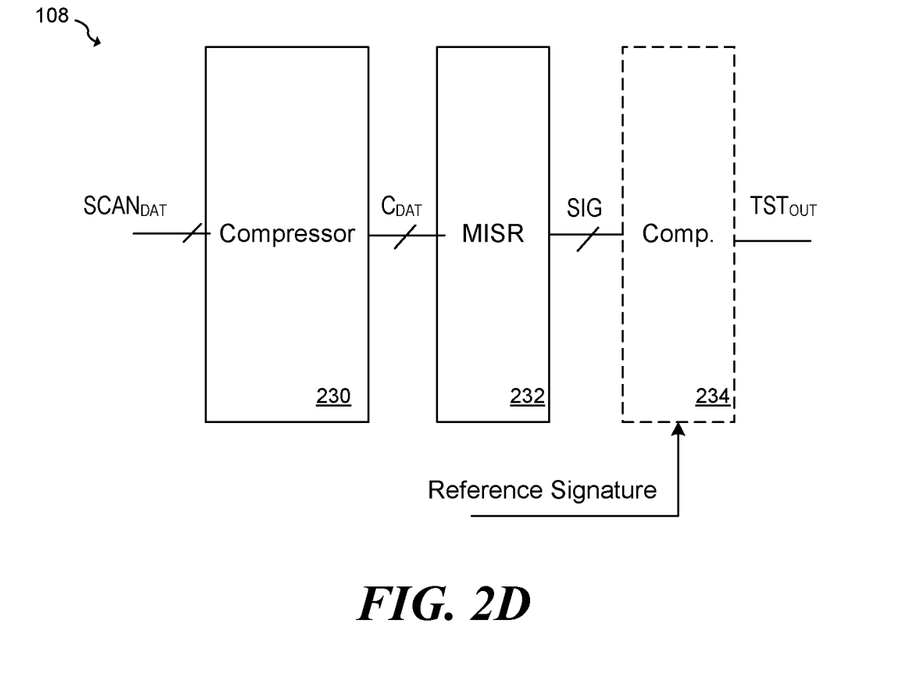
FIG. 2D illustrates a block diagram of an embodiment compressor/analyzer block.

Referring now to FIG. 2D, a block diagram of a possible implementation of compressor/analyzer 108 is illustrated that is configured to compress scan chain data $SCAN_{DAT}$ from scan chain block 106 and analyze the compressed data $C_{DAT}$ to help determine whether the circuit under test (CUT) 112 is functioning properly. Compressor/analyzer 108 includes a compressor block 230, a Multiple Input Signature Register (MISR) 232, and an optional comparator 234. The compressor block 230 is responsible for receiving scan chain data $SCAN_{DAT}$ and compressing it into a compressed data format $C_{DAT}$. Various compression techniques can be employed in the compressor block 230, such as run-length encoding, Huffman coding, or other lossless data compression algorithms. The specific implementation of the compressor block 230 may vary depending on the desired compression efficiency and complexity trade-offs.

The MISR 232 is a linear feedback shift register (LFSR) that inputs the compressed data $C_{DAT}$ produced by the compressor block 230 and generates a signature, denoted as SIG. The MISR 232 operates by XORing the compressed data CDAT with the current contents of the register, then shifting the contents and updating the register with the XOR results. The final content of the MISR 232 after processing all compressed data represents the signature SIG.

Comparator 234 is configured to compare the signature SIG generated by the MISR 232 to a reference signature, which represents the expected output for a properly functioning CUT 112. The comparator 234 may be implemented using digital logic circuits, such as a set of XOR gates and AND gates or any other suitable comparison circuitry. The output of the comparator 234 is a test output $TST_{OUT}$, which is indicative of whether the CUT 112 is functioning properly. If the signature SIG matches the reference signature, $TST_{OUT}$ will indicate that the CUT 112 is functioning correctly. In case of a mismatch, $TST_{OUT}$ will signal the presence of a fault in the CUT 112. In some embodiments, the function of comparator 234 is performed by a test system that is external to PRPG-based scan test system 101 and/or integrated circuit 102. In such embodiments, the output of compressor/analyzer 108 is the signature SIG produced by MISR 232.

It should be understood that the specific implementation of the compressor block 230, MISR 232, and comparator 234 may vary depending on the particular system and its specification. In alternative embodiments, compressor/analyzer 108 may be implemented by using XOR-tree to compact design responses, or chain-selector logic that allows only certain chains/cycles to be observed at the primary output pins.

Figure 3:
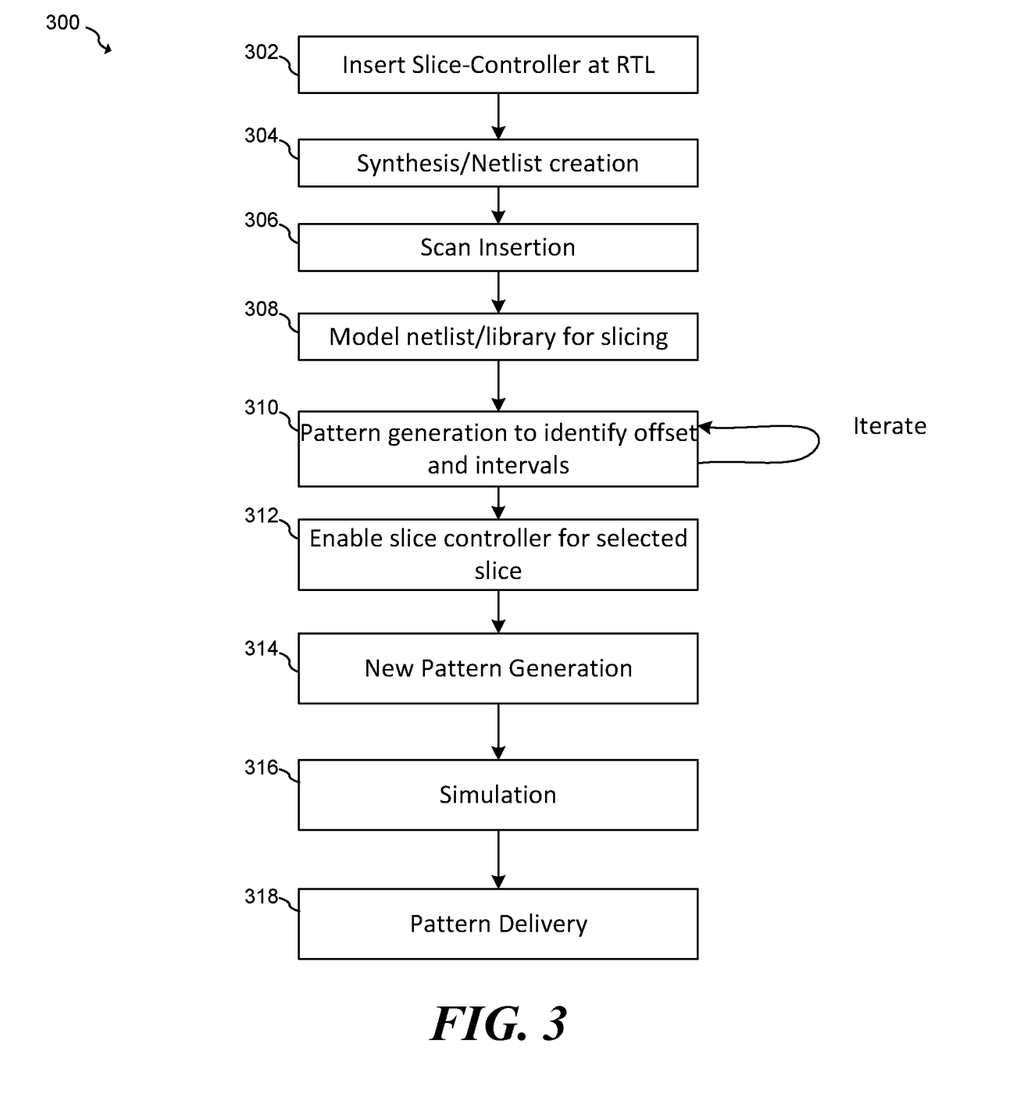
FIG. 3 illustrates a method designing and implementing a PRPG-based scan test system according to an embodiment.

FIG. 3 illustrates a method 300 designing and implementing a PRPG-based scan test system 101 according to an embodiment of the present invention. In step 302 an RTL description of control circuit 110 is written that describes how modified clock signal CLK2 is generated. Next, in step 304 logic is synthesized and a logic netlist is produced. In step 306, scan insertion is performed, and in step 308 a model netlist/library for slicing is produced. The netlist/modeling library may be used by commercial EDA tools to help implement the final design.

In step 310, test patterns are iteratively generated and simulated over various combinations of parameters for omitting clock cycles for purpose of increasing the density of care bits as described above. In embodiments that omit clock cycles in a periodic manner as described above with respect to FIGS. 2A and 2B, parameters such as offset value p and interval value n may be iteratively adjusted in order to enhance or optimize fault detection probability and/or reduce test time. Aside from the selection of clock skipping parameters, the generation of the patterns may be performed using pattern generation techniques known in the art. The generation of these scan patterns typically involves design automation tools including design tools provided by various EDA tool vendors.

First, the design automation tools generate a set of test patterns that are designed to exercise the circuit under test (CUT) 112 and identify potential faults. These test patterns are often derived from a fault model, which defines the types of faults that could occur within the circuit, such as stuck-at faults, bridging faults, or delay faults.

To generate the scan patterns, the test patterns may be compressed by a PRPG-based compressor or a software model of a PRPG-based compressor. The PRPG-based decompressor 104, as described previously, decompresses these compressed test patterns into scan patterns that can be shifted into the scan chains during operation of PRPG-based scan test system 101.

Design tools such as Automatic Test Pattern Generation (ATPG) software and tools for design-for-testability (DFT) can be used for creating the initial test patterns and implementing decompression and compression techniques. These tools often have built-in support for various decompression and compression algorithms, as well as fault models, which enables efficient generation of scan patterns tailored to the specific requirements of the CUT 112.

In step 312 slice controller is enabled for a selected slice identified during step 310. In step 314, a new pattern generation is performed, and in step 316 a simulation is performed.

In step 318, the final test input patterns and corresponding reference signatures are determined and delivered after simulation and verification. Such delivery may include providing the test input patterns and expected signatures to automated test equipment or writing these values in memory resident in and/or accessible to integrated circuit 102.

Figure 4:
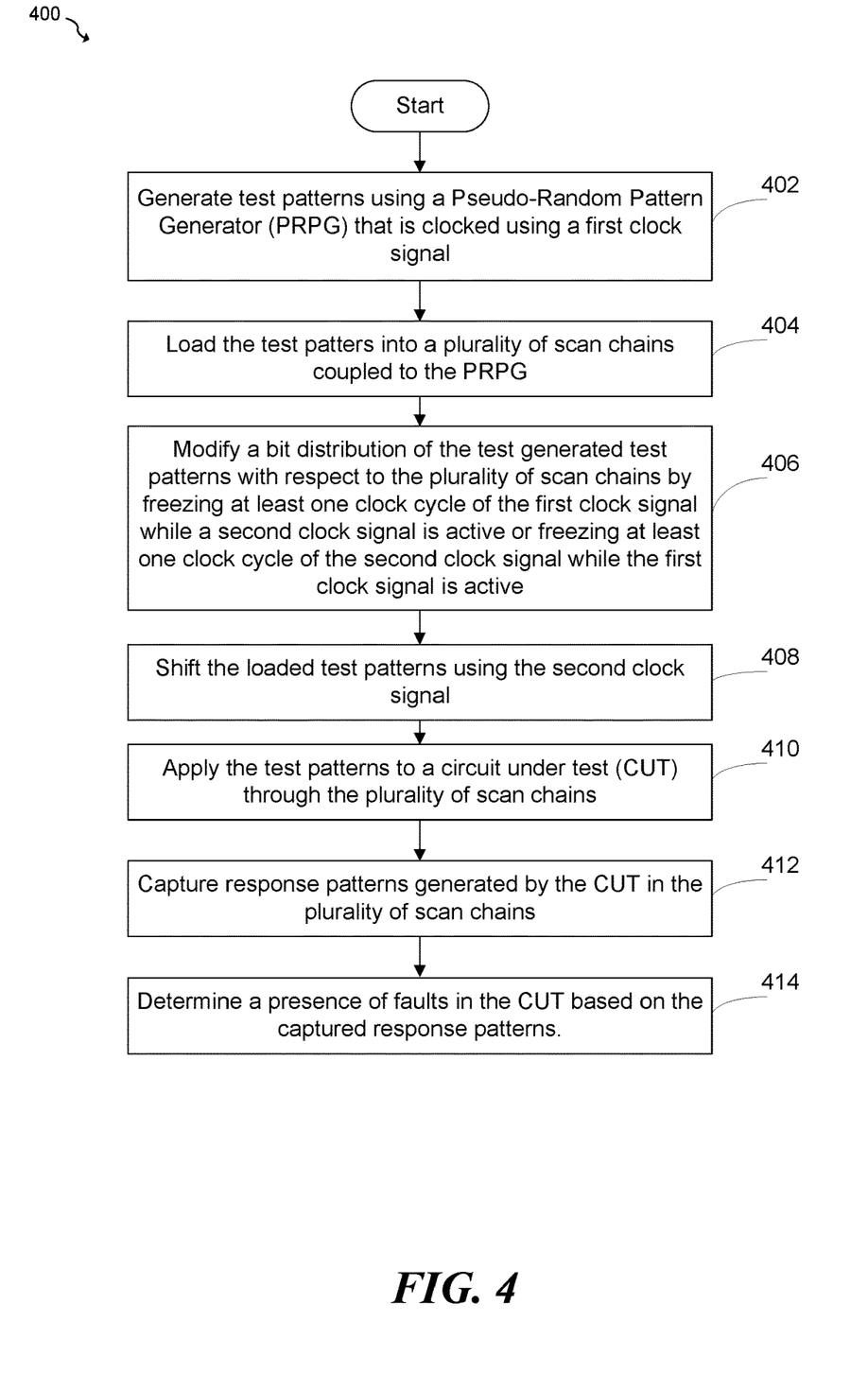
FIG. 4 illustrates a method for operating an embodiment PRPG-based scan test system.

FIG. 4 illustrates a method 400 for operating an embodiment PRPG-based scan test system. In step 402, test patterns using a PRPG clocked by a first clock signal, such as PRPG-based decompressor 104 that is clocked by input clock CLK 1 as described above. The test patterns are loaded into a plurality of scan chains, such as scan chains 116 of scan chain block 106, coupled to the PRPG in step 404.

In step 406, the bit distribution of the generated test patterns with respect to the plurality of scan chains are modified by freezing at least one clock cycle of the first clock signal while a second clock signal is active, or freezing at least one clock cycle of the second clock signal while the first clock signal is active. In step 408 the loaded test patterns are shifted using the second clock signal. Cycles of the first clock or the second clock may be frozen by gating the respective clock as described above with respect to FIGS. 1B, 1C, 2A and 2B. For example, columns or slices of test pattern data may be removed by freezing the clock corresponding to respective column or slice of test pattern such so that the removed column or is not shifted into scan chain block 106.

In step 410, the test patterns stored by plurality of scan chains is applied to a circuit under test (CUT), and in step 412, the response patterns generated by the CUT are captured by the plurality of scan chains in scan chain block 106. In step 414 the presence of faults in the CUT is determined based on the captured response patterns. Step 414 may be performed, for example, using compressor/analyzer 108 or a combination of compressor/analyzer 108 and additional logic resident on integrated circuit 102 or using an external tester. For example, in some embodiments, compressor/analyzer 108 is configured to produce a signature and the external tester is configured to compare the signature to a reference signature.

Figure 5:
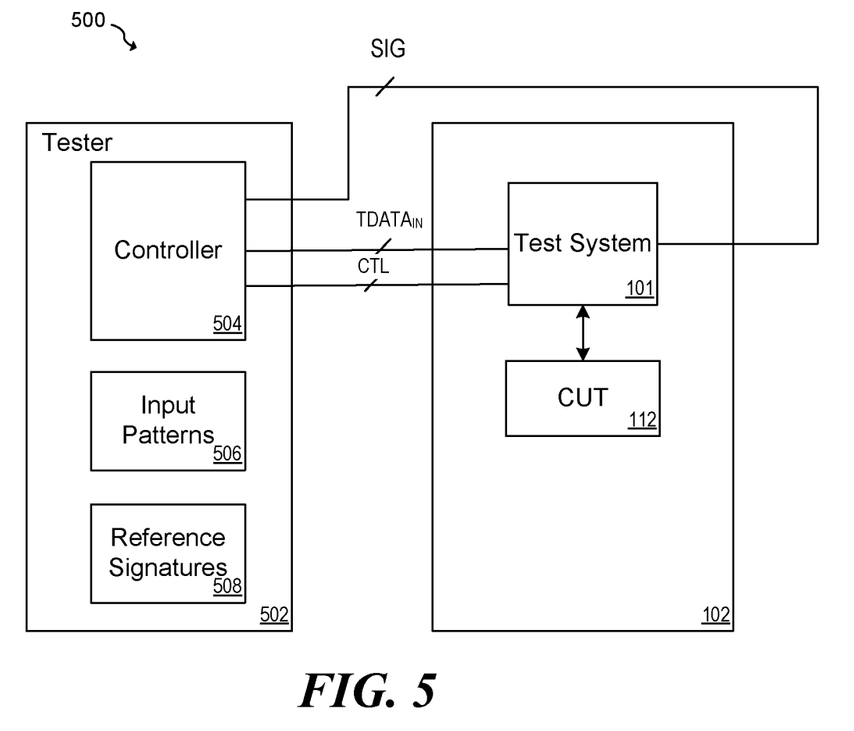
FIG. 5 illustrates a block diagram of a system that includes an integrated circuit (IC) having an embodiment PRPG-based scan test system coupled to an external tester.

FIG. 5 illustrates a block diagram of a system 500 that includes an integrated circuit (IC) 102 coupled to an external tester 502. The IC 102 comprises the PRPG-based test system 101 and the circuit under test (CUT) 112, as previously described. The tester 502 is configured to control the testing process and analyze the test results.

As shown, tester 502 includes a controller 504, which has a data output providing compressed input test data $TDATA_{IN}$ to the PRPG-based test system 101. The controller 504 is also configured to receive signatures SIG produced by PRPG-based test system 101 and to control the operation of PRPG-based test system 101 via control bus CTL. Test input patterns 506 and reference signatures 508 are stored in memory within tester 502 or in memory accessible by tester 502. Controller 504 may be implemented using a programmable processor such as a microcontroller or microprocessor coupled to memory or another type of non-transitory computer readable medium storing a program to implement the functionality described herein.

During operation, controller 504 configures PRPG-based test system 101 via control bus CTL. Control data may include, for example, clock signal CLK1, values and/or parameters related to clock skipping behavior of input clock CLK1 or CLK2, and other values used to configure and control the various modes and test phases of PRPG-based test system 101.

Controller 504 may be configured to provide input patterns 506 to test system 101 via test data $TDATA_{IN}$. Input patterns 506 may include compressed test input data and/or one or more seed values for PRPG-based decompressor 104 as described above. During operation, controller 504 is configured to receive signature data SIG provided by test system 101 and compare the received signature data SIG with reference signatures 508. Accordingly, controller 504 may determine the presence of a fault within CUT 112 when a received signature SIG does not match a reference signature. In some embodiments, tester 502 may be implemented by automatic test equipment (ATE). Alternatively, the functionality of tester 502 may be resident within integrated circuit 102 or within a system coupled to integrated circuit 102 within a manufactured system.

Embodiments of the present invention are summarized here. Other embodiments can also be understood from the entirety of the specification and the claims filed herein.

Example 1. A method for operating a Pseudo-Random Pattern Generator (PRPG) based scan test system including: generating test patterns using a Pseudo-Random Pattern Generator (PRPG), generating the test patterns including clocking the PRPG using a first clock signal; loading the test patterns into a plurality of scan chains coupled to the PRPG; modifying a bit distribution of the generated test patterns with respect to the plurality of scan chains by freezing at least one clock cycle of the first clock signal while a second clock signal is active or freezing at least one clock cycle of the second clock signal while the first clock signal is active; shifting the loaded test patterns using the second clock signal; applying the test patterns to a circuit under test (CUT) through the plurality of scan chains; and capturing response patterns generated by the CUT in the plurality of scan chains.

Example 2. The method of example 1, further including compressing the captured response patterns using a compressor, where generating the test patterns includes decompressing at least one test input pattern using the PRPG.

Example 3. The method of example 2, where the at least one test input pattern includes a seed value for the PRPG.

Example 4. The method of one of examples 2 to 3, where generating the test patterns further includes phase shifting an output of the PRPG.

Example 5. The method of one of examples 1 to 4, further including: applying the captured response patterns to a compressor; and clocking the compressor with the first clock signal.

Example 6. The method of example 5, where the compressor includes a multiple input signature register (MISR).

Example 7. The method of one of examples 5 or 6, further including determining a presence of faults in the CUT by comparing an output of the compressor to a reference signature.

Example 8. The method of one of examples 1 to 7, where modifying the bit distribution includes freezing the at least one clock cycle of the second clock signal while the first clock signal is active once every n first clock cycles, where n is an integer greater than or equal to zero.

Example 9. The method of one of example 8, further including delaying the freezing of at least one clock cycle of the second clock signal by an offset value p, where p is an integer greater than or equal to zero.

Example 10. The method of one of examples 1 to 9, where loading the test patterns into the plurality of scan chains includes loading the test patterns into a plurality of registers of the plurality of scan chains.

Example 11. The method of one of examples 1 to 10, further including determining a presence of faults in the CUT based on the captured response patterns.

Example 12. A system including: a test system configured to be coupled to a circuit under test (CUT), the test system including: a pattern generation circuit including a Pseudo-Random Pattern Generator (PRPG) coupled to a first clock input; a plurality of scan chains coupled to an output of the PRPG and configured to be coupled to the CUT, the plurality of scan chains including registers having clock inputs coupled to a second clock input; an evaluation circuit coupled to the plurality of scan chains, the evaluation circuit configured to capture response patterns generated by the CUT in the plurality of scan chains; and a control circuit configured to modify a bit distribution of test patterns generated by the PRPG with respect to the plurality of scan chains by freezing at least one clock cycle of the first clock signal while the second clock signal is active or freezing at least one clock cycle of the second clock signal while the first clock signal is active.

Example 13. The system of example 12, where: the pattern generation circuit includes a decompressor; and the evaluation circuit includes a compressor.

Example 14. The system of example 13, where the compressor includes a multiple input signature register (MISR).

Example 15. The system of one of examples 13 or 14, where the decompressor includes: the PRPG; and a phase shifter coupled to an output of the PRPG.

Example 16. The system of one of examples 12 to 15, where the control circuit is configured to: freeze the second clock signal while the first clock signal is active once every n first clock cycles, where n is an integer greater than or equal to zero.

Example 17. The system of example 16, where the control circuit is further configured to delay the frozen at least one clock cycle of the second clock signal by an offset value p, where p is an integer greater than or equal to zero.

Example 18. The system of one of examples 12 to 17, further including the CUT.

Example 19. The system of one of examples 12 to 18, where the test system and the CUT are disposed on a single monolithic integrated circuit.

Example 20. The system of one of examples 12 to 19, where the evaluation circuit is further configured to determine a presence of faults in the CUT based on the captured response patterns.

Example 21. An integrated circuit including: a control circuit configured to produce a modified clock signal based on an input clock signal, and freeze at least one clock cycle of the modified clock signal while the input clock signal is active; a Pseudo-Random Pattern Generator (PRPG) based decompressor having an input configured to receive at least one seed value, where the PRPG-based decompressor includes a clock input configured to receive the input clock signal; a plurality of scan chains coupled to the PRPG-based decompressor, the plurality of scan chains having registers with clock inputs configured to receive the modified clock signal; a compressor coupled to the plurality of scan chains, the compressor including a clock input configured to receive the input clock signal; and a circuit under test (CUT) coupled to the plurality of scan chains.

Example 22. The integrated circuit of example 21, where the control circuit is configured to freeze the at least one clock cycle of the modified clock signal while the input clock signal is active once every n first clock cycles, where n is an integer greater than or equal to zero.

Example 23. The integrated circuit of one of examples 21 or 22, where the compressor includes a multiple input signature register (MISR).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for operating a Pseudo-Random Pattern Generator (PRPG) based scan test system comprising:
   generating test patterns using a Pseudo-Random Pattern Generator (PRPG), generating the test patterns comprising clocking the PRPG using a first clock signal;
   loading the test patterns into a plurality of scan chains coupled to the PRPG;
   shifting the loaded test patterns using a second clock signal;
   modifying a bit distribution of the generated test patterns with respect to the plurality of scan chains comprising:
      freezing at least one clock cycle of the first clock signal while the second clock signal is active, wherein freezing the at least one clock cycle of the first clock signal causes a same pattern output by the PRPG to be clocked into the plurality of scan chains, or
      freezing at least one clock cycle of the second clock signal while the first clock signal is active, wherein freezing the at least one clock cycle of the second clock signal prevents a first pattern output by the PRPG from being clocked into the plurality of scan chains;
   applying the test patterns to a circuit under test (CUT) through the plurality of scan chains; and
   capturing response patterns generated by the CUT in the plurality of scan chains.

2. The method of claim 1, further comprising compressing the captured response patterns using a compressor, wherein generating the test patterns comprises decompressing at least one test input pattern using the PRPG.

3. The method of claim 2, wherein the at least one test input pattern comprises a seed value for the PRPG.

4. The method of claim 2, wherein generating the test patterns further comprises phase shifting an output of the PRPG.

5. The method of claim 1, further comprising:
   applying the captured response patterns to a compressor; and
   clocking the compressor with the first clock signal.

6. The method of claim 5, wherein the compressor comprises a multiple input signature register (MISR).

7. The method of claim 5, further comprising determining a presence of faults in the CUT by comparing an output of the compressor to a reference signature.

8. The method of claim 1, wherein modifying the bit distribution comprises freezing the at least one clock cycle of the second clock signal while the first clock signal is active once every n first clock cycles, wherein n is an integer greater than or equal to zero.

9. The method of claim 8, further comprising delaying the freezing of at least one clock cycle of the second clock signal by an offset value p, where p is an integer greater than or equal to zero.

10. The method of claim 1, wherein loading the test patterns into the plurality of scan chains comprises loading the test patterns into a plurality of registers of the plurality of scan chains.

11. The method of claim 1, further comprising determining a presence of faults in the CUT based on the captured response patterns.

12. The method of claim 1, wherein modifying the bit distribution of the generated test patterns is configured to increase a temporal proximity of care bits produced by the PRPG.

13. A system comprising:
a test system configured to be coupled to a circuit under test (CUT), the test system comprising:
a pattern generation circuit comprising a Pseudo-Random Pattern Generator (PRPG) coupled to a first clock input;
a plurality of scan chains coupled to an output of the PRPG and configured to be coupled to the CUT, the plurality of scan chains comprising registers having clock inputs coupled to a second clock input;
an evaluation circuit coupled to the plurality of scan chains, the evaluation circuit configured to capture response patterns generated by the CUT in the plurality of scan chains; and
a control circuit configured to modify a bit distribution of test patterns generated by the PRPG with respect to the plurality of scan chains by:
freezing at least one clock cycle of a first clock signal while a second clock signal is active, wherein freezing the at least one clock cycle of the first clock signal is configured to cause a same pattern output by the PRPG to be clocked into the plurality of scan chains, or
freezing at least one clock cycle of the second clock signal while the first clock signal is active, wherein freezing the at least one clock cycle of the second clock signal prevents a first pattern output by the PRPG from being clocked into the plurality of scan chains.

14. The system of claim 13, wherein:
the pattern generation circuit comprises a decompressor; and
the evaluation circuit comprises a compressor.

15. The system of claim 14, wherein the compressor comprises a multiple input signature register (MISR).

16. The system of claim 14, wherein the decompressor comprises:
the PRPG; and
a phase shifter coupled to an output of the PRPG.

17. The system of claim 13, wherein the control circuit is configured to:
freeze the second clock signal while the first clock signal is active once every n first clock cycles, wherein n is an integer greater than or equal to zero.

18. The system of claim 16, wherein the control circuit is further configured to delay the frozen at least one clock cycle of the second clock signal by an offset value p, where p is an integer greater than or equal to zero.

19. The system of claim 13, further comprising the CUT.

20. The system of claim 19, wherein the test system and the CUT are disposed on a single monolithic integrated circuit.

21. The system of claim 13, wherein the evaluation circuit is further configured to determine a presence of faults in the CUT based on the captured response patterns.

22. The system of claim 13, wherein the control circuit is configured to modify the bit distribution of the generated test patterns to increase a temporal proximity of care bits produced by the PRPG.

23. An integrated circuit comprising:
a control circuit configured to produce a modified clock signal based on an input clock signal, and freeze at least one clock cycle of the modified clock signal while the input clock signal is active;
a Pseudo-Random Pattern Generator (PRPG) based decompressor having an input configured to receive at least one seed value, wherein the PRPG-based decompressor comprises a clock input configured to receive the input clock signal;
a plurality of scan chains coupled to the PRPG-based decompressor, the plurality of scan chains having registers with clock inputs configured to receive the modified clock signal, wherein the modified clock signal is configured to prevent a first pattern output by the PRPG from being clocked into the plurality of scan chains when the at least one clock cycle of the modified clock signal is frozen;
a compressor coupled to the plurality of scan chains, the compressor comprising a clock input configured to receive the input clock signal; and
a circuit under test (CUT) coupled to the plurality of scan chains.

24. The integrated circuit of claim 23, wherein the control circuit is configured to freeze the at least one clock cycle of the modified clock signal while the input clock signal is active once every n first clock cycles, wherein n is an integer greater than or equal to zero.

25. The integrated circuit of claim 23, wherein the compressor comprises a multiple input signature register (MISR).

26. The integrated circuit of claim 23, wherein the control circuit is configured freeze the at least one clock cycle of the modified clock signal to increase a temporal proximity of care bits produced by the PRPG.

* * * * *